United States Patent [19]

Prados

[11] Patent Number: 4,995,820

[45] Date of Patent: Feb. 26, 1991

[54] SCREENING EDGE MASK FOR PRINTED CIRCUIT BOARD, WITH WITHDRAWING-RETAINING MECHANISM

[75] Inventor: Rafael R. Prados, Madrid, Spain

[73] Assignee: Telefonica De Espana, S.A., Madrid, Spain

[21] Appl. No.: 452,102

[22] Filed: Dec. 18, 1989

[30] Foreign Application Priority Data

May 10, 1989 [ES] Spain .................................. 8901600

[51] Int. Cl.⁵ .......................................... H01R 13/62
[52] U.S. Cl. .................................................... 439/157
[58] Field of Search ................................. 439/152–157

[56] References Cited

U.S. PATENT DOCUMENTS 3,944,311  3/1976  Sprenkle et al. ..................... 439/157
4,071,722  1/1978  Hart ..................................... 439/157
4,243,283  1/1981  McSparran .......................... 439/157

Primary Examiner—Joseph H. McGlynn
Attorney, Agent, or Firm—Mason, Fenwick & Lawrence

[57] ABSTRACT

An edge mask for a printed circuit board comprises a T-sectioned strip 1, to the base web of which can be secured a printed circuit board, via lugs and screws. The strip 1 carries a handle 3 at each end pivoted on a respective shaft 13 having side walls which pass through a slot 8 and cut-away 7 and end in hooks 14 which engage a subframe member 11 of apparatus in which the board is assembled. The handles can occupy alternative retaining and pulling out positions, and are biased by respective springs 15 into the retaining position. Contact strips 10 are also provided for effecting an earth connection to the apparatus frame.

12 Claims, 3 Drawing Sheets

SCREENING EDGE MASK FOR PRINTED CIRCUIT BOARD, WITH WITHDRAWING-RETAINING MECHANISM

BACKGROUND OF THE INVENTION

This invention relates to an edge mask or screened mask for circuit boards, the mask having a combined withdrawing and retaining mechanism, for mounting a printed circuit board or plate forming a part of electronic apparatus, the mask being mounted on and covering the outer exposed edge of such boards in order to enable both insertion into and withdrawal from their positions in the apparatus wherein they are installed.

The invention is applicable in the telephone and and electronics fields.

The purpose of edge masks being attached to electronic circuit boards is to allow insertion or extraction of them into or from their positions in the equipment wherein the boards are installed.

None of the many existing embodiments of edge masks known however has the feature required to give the desired facility to this insertion/extraction operation.

Furthermore, known presently existing masks lack an earthing device for the mask itself, in order to eliminate the latent danger of electric shock for the operators handling the boards installed in equipment.

SUMMARY OF THE INVENTION

An object of the invention is to provide a mask which will overcome these problems, being fitted with a dual purpose withdrawing and retaining mechanism, and including an earth connection in the mask itself.

According to the invention there is provided a screened edge mask with a withdrawing and retaining mechanism wherein the mask comprises a T-sectioned strip with unequal flanges, to which is attachable on one side a printed circuit board edge, and on the other side are mounted two withdrawing and retaining mechanisms effective to withdraw or to hold the printed circuit board in its installed position on an eqipment subframe.

The screened mask fitted with a withdrawing/retaining mechanism, as set forth above, constitutes an efficient solution to safely withdraw or retain the printed circuit board from or in their position of installation, as well as to retain them in their assembly position, thus avoiding operators suffering any electric shock while handling the boards.

The T-sectioned strip preferably constitutes a cover for the front edge of the printed circuit board, and is assembled onto it by means of screws and at least one pair of lugs fitted for this purpose to the strip.

The strip preferably has on the upper side of its flanges, two pairs of lugs set one one in front of the other one at each end to fix the two mechanisms used to retain and withdraw the printed circuit board. This strip may have, besides, a cut away part and a slot at each end through which pass the two hooks at each end with which each mechanism is preferably equipped, to latch with a member of the apparatus sub-frame, to retain the printed circuit board.

There are preferably also, on each end of the strip, housings lying on the lower side of the flanges, to house contact strips which electrically connect the strip to an equipment case earthing device.

The number of contact strips may depend on the length of the flanges, or the mask width. These contact strips may be bifurcated and have, as seen edge on, a double bend which which aids pressure of the contact strips upon the metal frame part on which they bear, Both mask withdrawing/retaining mechanisms are preferably identical to each other and are assembled on the ends of the strip in symmetrical positions. Each mechanism may be provided with a handle or pull having a suitable shape which is fixed on the mask by means of a shaft on which the handle turns, bearing on respective pairs of lugs on the mask itself.

The handle may have two hooks, constituted by extensions of respective parallel side walls which are engageable with a subframe member of the equipment, in order to hold the PCB in its installed position which is perpendicular to the said side walls; on its front wall the handle may have a further wall which abuts with the mask when the mechanism is in its resting position, wherein it is held by means of a pressure spring which, being installed in the handle or pull, acts with one end bearing on the further wall, and the other end bearing on the mask.

In order to withdraw the PCB, it is required to move the handle against the resistance of the spring. In this operation the lower part of the handle abuts the subframe member and starts withdrawing the PCB.

When introducing the PCB to its installed position, the rounded shape of the hooks of the withdrawing-/retaining mechanism permits a light pressure on the mask to act upon the handle, so that the hooks become housed in their anchoring position, wherein they are held by the spring until the handle is actuated to withdraw it.

BRIEF DESCRIPTION OF THE DRAWINGS

A preferred embodiment of the invention will now be described, by way of example with reference to the accompanying drawings, wherein.

DETAILED DESCRIPTION OF THE PREFERRED EMBODIMENTS

Figure 1:
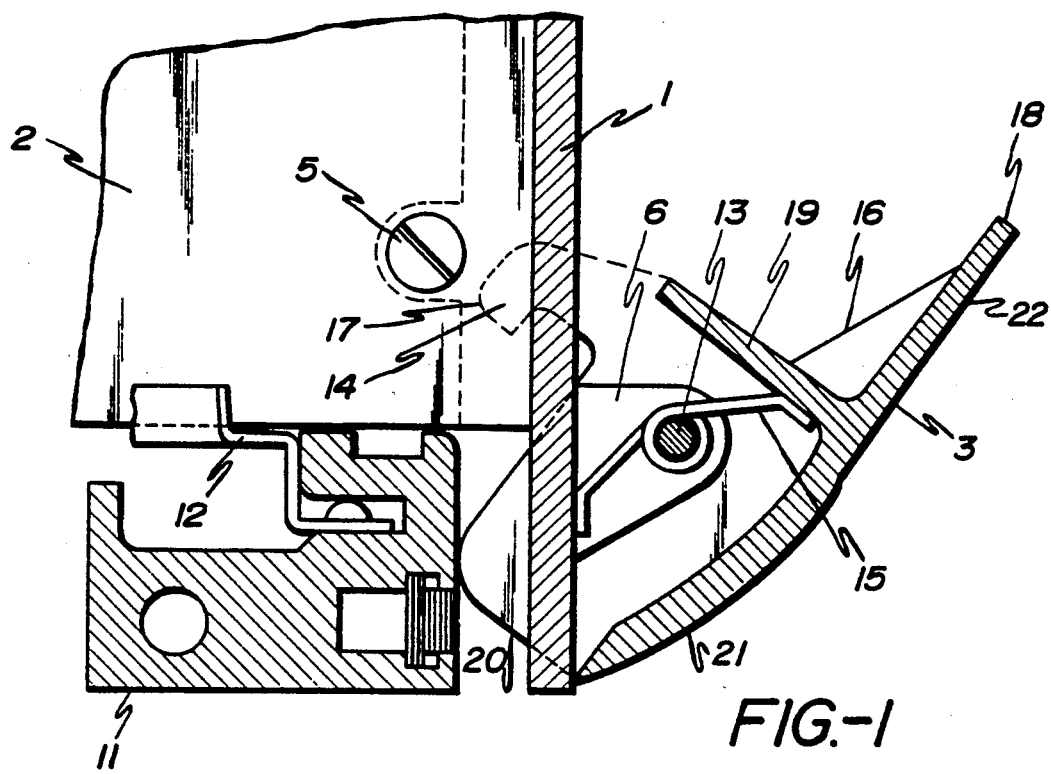
FIG. 1 is a lateral sectional view showing the mask withdrawing/retaining mechanism in its position for withdrawing a PCB.

In the above drawings, it may be noted that the screened mask fitted with a withdrawing/retaining device according to the invention comprises a strip 1, of T-shaped cross-section with unequal flanges, to which are secured, on one side a printed circuit board (PCB) 2, and on the other two identical symmetrically positioned mechanisms 3, acting to withdraw and retain the PCB 2, which remains retained thereby when introduced to its assembled position.

Strip 1 which as said above, is formed in a T-section forms a mask which covers the exposed edge of the PCB 2, as it is connected thereto by means of lugs 4 and screws 5. The lugs 4 are assembled for this purpose on a step part constituting a support 17 for the T-sectioned strip 1.

On the upper side of the T-flanges, the strip is fitted with two pairs of lugs 6, placed one in front of the other, having one pair at each end, in order to fix therein the two mechanisms 3, which are used to retain or withdraw the PCB 2.

There are also between the ends of the strip, housings 9, placed on the inside face of the T-flanges, where some conductor strips 10 are housed, which electrically connect the strip 1 with the equipment case earth connection through a subframe member 11. The number of contact strips 10 depends on the length of the strip 1.

Figure 6:
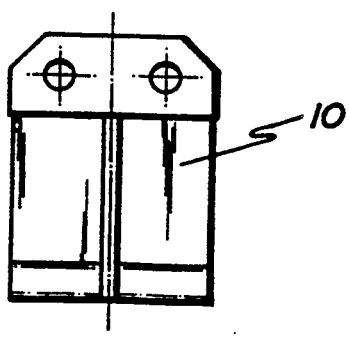
FIG. 6 is an elevational view of a contact strip.
Figure 7:
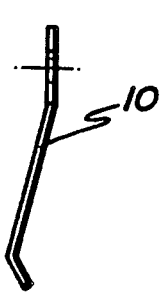
FIG. 7 is a side view of the contact strip of FIG. 6.
Figure 5:
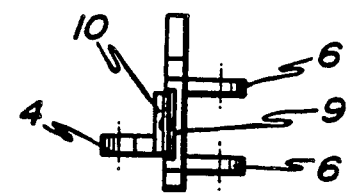
FIG. 5 is a plan view of the strip of FIGS. 3 and 4.
Figure 8:
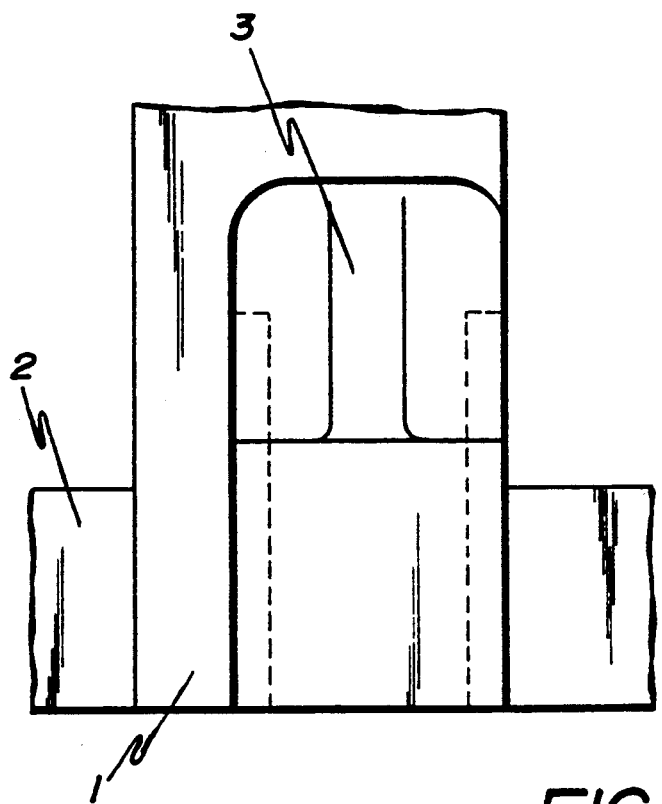
FIG. 8 is an elevational view of a withdrawing-/retaining mechanism handle.
Figure 9:
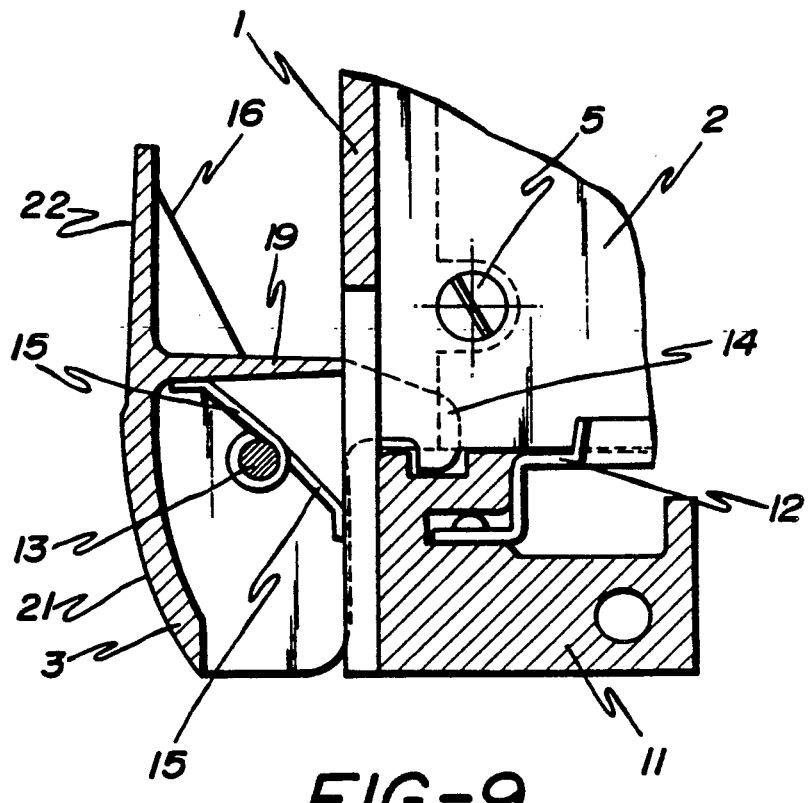
FIG. 9 is a sectional side view of the mechanism in rest position, retaining the PCB in its installed position.

These contact strips 10 are bifurcated as seen in plan, as shown in FIG. 6, and are also provided with a double flexure bend which assists the contact strips 10 to maintain pressure contact on the member 11, as is shown in FIG. 7.

The two withdrawing/retaining mechanisms 3 are identical and are assembled one at each end of strip 1 which covers the front edge of the PCB, in a symmetrical position with regard to the longitudinal axis of the strip 1.

The mechanisms 3 each comprise a handle or pull 18 of suitable shape, connected to strip 1 by means of a shaft 13, on which it pivots, bearing on a respective lug pair 4 of the strip 1. Handle 18 is reinforced by means of a triangular wall 16. The handle has two hooks 14 formed by extensions of its latteral walls 20, said hooks latching onto member 11 of the equipment frame, to hold the PCB securely in its installed position.

Figure 2:
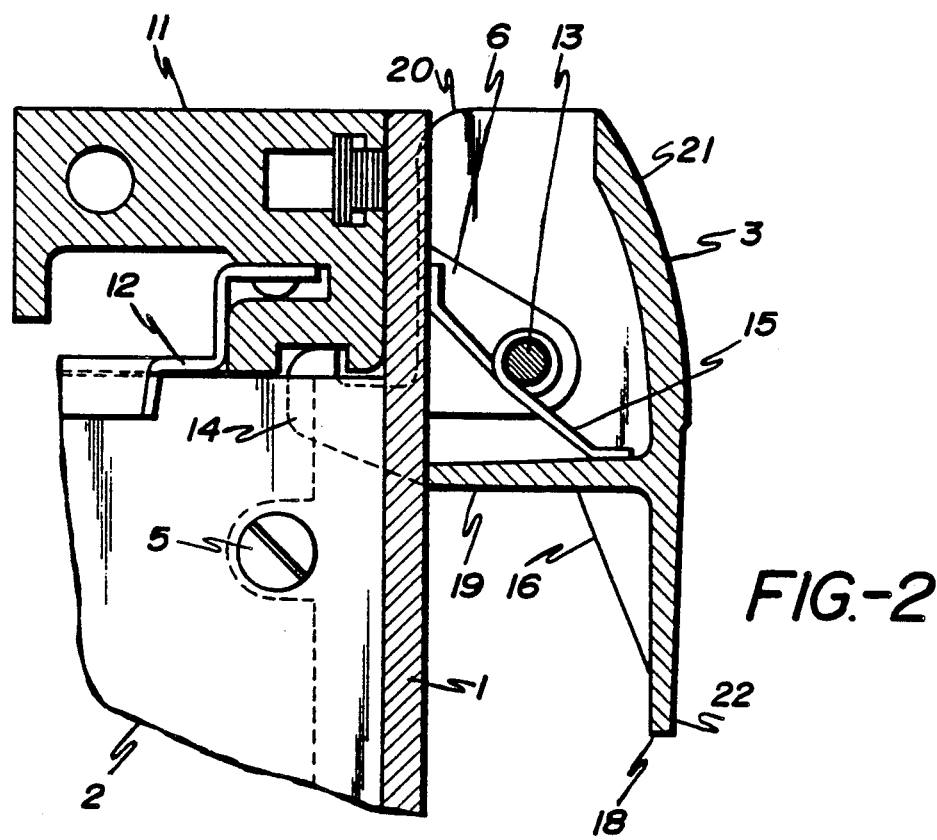
FIG. 2 shows the mechanism of FIG. 1 in its retaining position.

The handle 18 has, perpendicular to its latteral walls 21, 22 and its front wall 20, a further wall 19, which abuts strip 1 when the withdrawing/retaining mechanism 3 is in its resting position (FIG. 2), by means of the action of spring 15 which is coiled on shaft 13 and acts through one of its ends bearing on wall 19 and the other bearing on strip 1.

Figure 3:
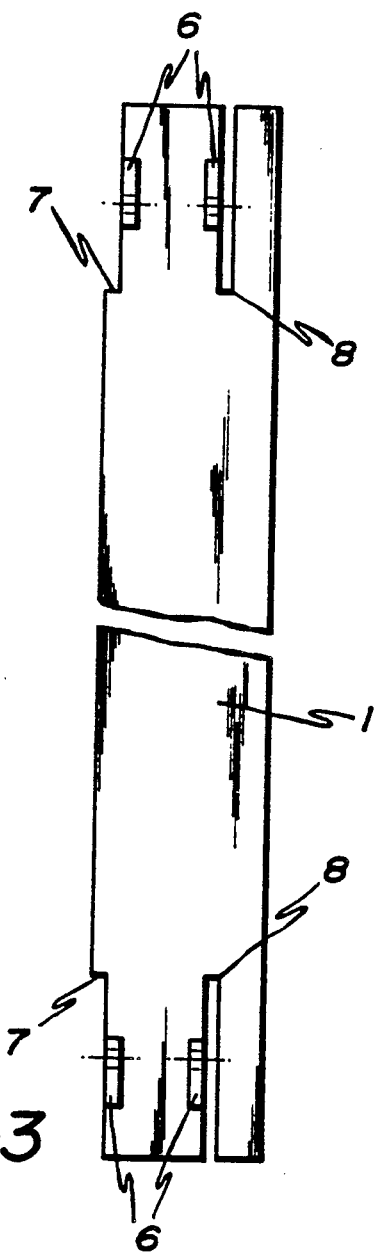
FIG. 3 is a side elevation of the T-sectioned strip which constitutes the mask.
Figure 4:
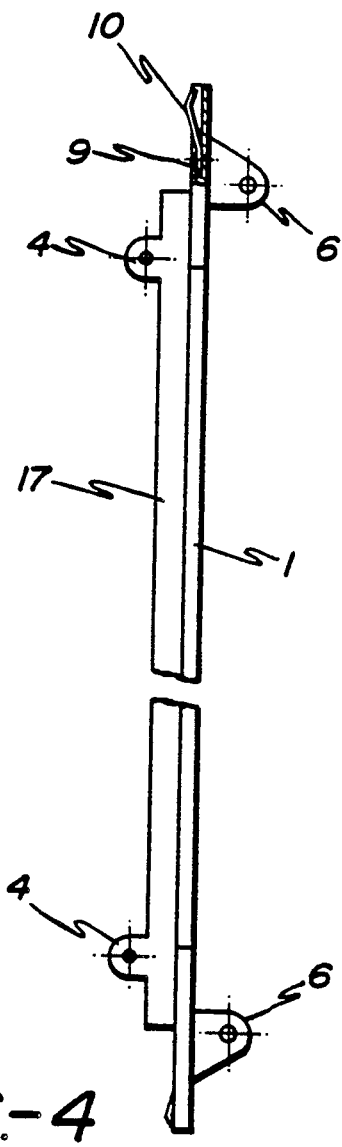
FIG. 4 is a side view of the strip of FIG. 3.

The hooks 14 pass one through a slot 8 in the end of strip 1 and the other through a cut away portion 7 in the end of the strip 1 (FIG. 3).

To withdraw the PCB 2, it is necessary to move the handle 18 thus overcoming the resistance of spring 15. In this operation, the mechanism 3 lower part presses on the member 11 and starts levering out the PCB 2.

When inserting the PCB 2 into its installed position, the rounded shape of the hooks 14 of the mechanisms 3 allows a user to act with a slight pressure on the flanges of the strip 1 by means of which the hooks 14 engage into their anchoring positions wherein they are held by the action of spring 15 until handle 18 is moved to extract the board.

It is not deemed necessary to enlarge this description for any expert in this subject matter to understand the scope and advantages of the invention. The materials, shape, size and disposition of parts may be modified within the scope of the invention and all terms used hereinbefore are not to be construed in any limiting sense.

I claim:

1. A screened edge mask for a printed circuit board, the mask comprising:
    a T-sectioned strip with unequal flanges to which is attachable on one side a printed circuit board edge, and on the other side are mounted two withdrawing and retaining mechanisms for withdrawing or for holding the printed circuit board in an installed position on an equipment frame.

2. The edge mask according to claim 1, wherein at or near the ends of the strip are housings in the lower side of the length of the T-sectioned strip's flanges with contact strips, the contact strips being present in a quantity depending on the the flanges' length, the contact strips including a double flexure bend to aid pressure contact with an earth connection in the equipment frame.

3. The edge mask according to claim 1 wherein the T-sectioned strip covers an outer edge of the printed circuit board, having lugs on a base web of the T, to which lugs the printed circuit board is fixed by screws.

4. The edge mask according to claim 3 wherein on the upper face of the T-sectioned strip's flanges, the strip has two pairs of lugs placed opposite to each other, having a pair at or near each end of the strip which allows mounting of the two withdrawing and retaining mechanisms on the strip, there being at or near each end of the strip a cut away portion and a slot parallel thereto in order to allow operation of the mechanisms.

5. The edge mask according to claim 1, further comprising two identical withdrawing and retaining mechanisms which are symmetrically placed on the strip with respect to the longitudinal axis of the strip whereon they are mounted by means of respective shafts upon which the mechanisms pivot.

6. The edge mask according to claim 5 wherein each handle has two hooks, constituted by elongation of respective side walls, with corners rounded, a horizontal wall perpendicular to the side walls and a front wall, and one triangular wall to reinforce the front wall, abutting the mask when the mechanism is in a rest-/retaining position, the horizontal wall perpendicular to its side walls, the triangular wall reinforcing the front wall performing a retaining function when the mechanism is in use.

7. The edge mask according to claim 1, wherein the two mechanisms each include a handle, a pivot shaft and a spring.

8. The edge mask according to claim 7 wherein the pivot shaft allows mounting of the mechanism on the strip.

9. The edge mask according to claim 7, wherein each handle has two hooks, constituted by elongation of respective side walls, with corners rounded, a horizontal wall perpendicular to the side walls and a front wall, and one triangular wall to reinforce the front wall, abutting the mask when the mechanism is in a rest-/retaining position, the horizontal wall perpendicular to its side walls, the triangular wall reinforcing the front wall performing a retaining function when the mechanism is in use.

10. The edge mask according to claim 7 wherein the spring is installed about the pivot shaft, and has two ends, one of which bears on the handle horizontal wall, and the other on the mask, in such a way that while in the rest position the spring holds the mechanism with its hooks received in a slot in the frame member.

11. The edge mask according to claim 10, wherein when the printed circuit board is held in its installed position, to withdraw it it is necessary to act on the mechanism to overcome the spring's resistance.

12. The edge mask according to claim 11 wherein when effecting the withdrawal operation, the handle presses on the subframe member thus initiating withdrawal of the printed circuit board.

* * * * *